United States Patent
Tanaka

(10) Patent No.: US 12,407,153 B2
(45) Date of Patent: Sep. 2, 2025

(54) ELECTRICAL JUNCTION BOX AND WIRE HARNESS

(71) Applicant: YAZAKI CORPORATION, Tokyo (JP)

(72) Inventor: Hiroyuki Tanaka, Kakegawa (JP)

(73) Assignee: YAZAKI CORPORATION, Tokyo (JP)

( * ) Notice: Subject to any disclaimer, the term of this patent is extended or adjusted under 35 U.S.C. 154(b) by 25 days.

(21) Appl. No.: 18/657,760

(22) Filed: May 7, 2024

(65) Prior Publication Data

US 2024/0380191 A1    Nov. 14, 2024

(30) Foreign Application Priority Data

May 10, 2023  (JP) ................... 2023-077799

(51) Int. Cl.
| | | |
|---|---|---|
| H05K 7/20 | (2006.01) | |
| H02G 3/03 | (2006.01) | |
| H02G 3/08 | (2006.01) | |

(52) U.S. Cl.
CPC ............... *H02G 3/03* (2013.01); *H02G 3/08* (2013.01); *H05K 7/2039* (2013.01); *H05K 7/20845* (2013.01)

(58) Field of Classification Search
CPC ................................................. H05K 7/20845
See application file for complete search history.

(56) References Cited

U.S. PATENT DOCUMENTS

| | | | |
|---|---|---|---|
| 10,707,771 B1* | 7/2020 | Chen ..................... | H02M 7/003 |
| 2015/0101838 A1* | 4/2015 | Shepard ............. | H05K 7/20854 |
| | | | 174/50 |
| 2015/0271956 A1* | 9/2015 | Sun .................... | H05K 7/20927 |
| | | | 361/692 |
| 2022/0248524 A1* | 8/2022 | Igura ................... | H05K 5/0026 |
| 2022/0312647 A1* | 9/2022 | Harsch .............. | H05K 7/20845 |
| 2023/0028967 A1* | 1/2023 | Louco ................... | H05K 5/003 |
| 2023/0255004 A1* | 8/2023 | Kloetzig ............. | H05K 5/0069 |
| | | | 361/760 |
| 2023/0301038 A1* | 9/2023 | Pouilly ............. | H05K 7/20845 |
| | | | 361/689 |

FOREIGN PATENT DOCUMENTS

| | | |
|---|---|---|
| JP | 2020-127302 A | 8/2020 |
| JP | 2021-52189 A | 4/2021 |

* cited by examiner

*Primary Examiner* — Hung V Ngo
(74) *Attorney, Agent, or Firm* — KENEALY VAIDYA LLP

(57) ABSTRACT

An electrical junction box includes a heat generating component, a cooling unit that cools the heat generating component, and a resin case that holds the heat generating component and the cooling unit. The cooling unit includes: a metal plate being formed in a shape conforming to a shape of a bus bar of the heat generating component; a metal pipe being disposed along and in contact with the metal plate and through which a coolant flows; and a heat transfer member having insulating properties and intervening between the heat generating component and the metal plate.

5 Claims, 5 Drawing Sheets

ELECTRICAL JUNCTION BOX AND WIRE HARNESS

CROSS-REFERENCE TO RELATED APPLICATION(S)

The present application claims priority to and incorporates by reference the entire contents of Japanese Patent Application No. 2023-077799 filed in Japan on May 10, 2023.

BACKGROUND OF THE INVENTION

1. Field of the Invention

The present invention relates to an electrical junction box and a wire harness.

2. Description of the Related Art

Conventionally, for example, JP 2021-052189 A discloses a configuration including: a relay and a bus bar as heat generating components; a cooling member that cools the relay and the bus bar; and a case made of resin that is a radiator and holds the relay, the bus bar, and the cooling member. The cooling member is formed by pressing a plate member made of metal into a substantially L shape. A heat conductive member made of resin is provided between the cooling member and the bottom face of the case.

In addition, conventionally, for example, JP 2020-127302 A discloses a configuration including: a relay and a bus bar as heat generating components; a heat transfer member that cools the bus bar; and a case that holds the relay, the bus bar, and the heat transfer member. The bus bar is formed in a substantially Z shape by providing a second portion extending in the up-down direction between a first portion and a third portion that extend in the same direction. The first portion is connected to the relay, and the third portion is connected to the heat transfer member.

Here, in order to improve the cooling performance, it is conceivable to increase the volume of the cooling member and the heat transfer member described above, but in this case, there are concerns about an increase in weight, an increase in size, and the like. Therefore, there is room for further improvement.

SUMMARY OF THE INVENTION

The present invention has been made in view of the above circumstances, and an object of the present invention is to provide an electrical junction box and a wire harness that can appropriately have cooling performance.

To achieve the object of the present invention, a electrical junction box according to one aspect of the present invention includes a heat generating component; a cooling unit being configured to cool the heat generating component; and a resin case being configured to hold the heat generating component and the cooling unit, wherein the cooling unit includes a metal plate being formed in a shape conforming to a shape of the heat generating component, a metal pipe through which a coolant flows, the metal pipe being disposed along and in contact with the metal plate, and a heat transfer member having insulating properties and intervening between the heat generating component and the metal plate.

To achieve the object of the present invention, a wire harness according to another aspect of the present invention includes a wiring member having electrical conductivity; and an electrical junction box being electrically connected to the wiring member, wherein the electrical junction box includes a heat generating component, a cooling unit being configured to cool the heat generating component, and a resin case being configured to hold the heat generating component and the cooling unit, and the cooling unit includes a metal plate being formed in a shape conforming to a shape of the heat generating component, a metal pipe through which a coolant flows, the metal pipe being disposed along and in contact with the metal plate, and a heat transfer member having insulating properties and intervening between the heat generating component and the metal plate.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an embodiment according to the present invention will be described in detail with reference to the drawings. Note that this invention is not limited to the embodiment. Constituent elements in the following embodiment include those that can be easily replaced by a person skilled in the art or those that are substantially the same.

In the following description, three directions intersecting one another are referred to as a "length direction (first direction) X", a "width direction (second direction) Y", and a "height direction (third direction) Z" for convenience. Here, the length direction X, the width direction Y, and the height direction Z are orthogonal to one another. Typically, the length direction X and the width direction Y correspond to a horizontal direction (also referred to as a planar direction). Typically, the length direction X corresponds to a long side direction of an electrical junction box 10, and the width direction Y corresponds to a short side direction of the electrical junction box 10. Typically, the height direction Z corresponds to the vertical direction. A "vertically upper side", "vertically upward", or "vertically above" is referred to as an "upper portion", an "upper side", "upper", "upward", or "above", and a "vertically lower side", "vertically downward", or "vertically below" is referred to as a "lower portion", a "lower side", "lower", "downward", or "below".

Figure 1:
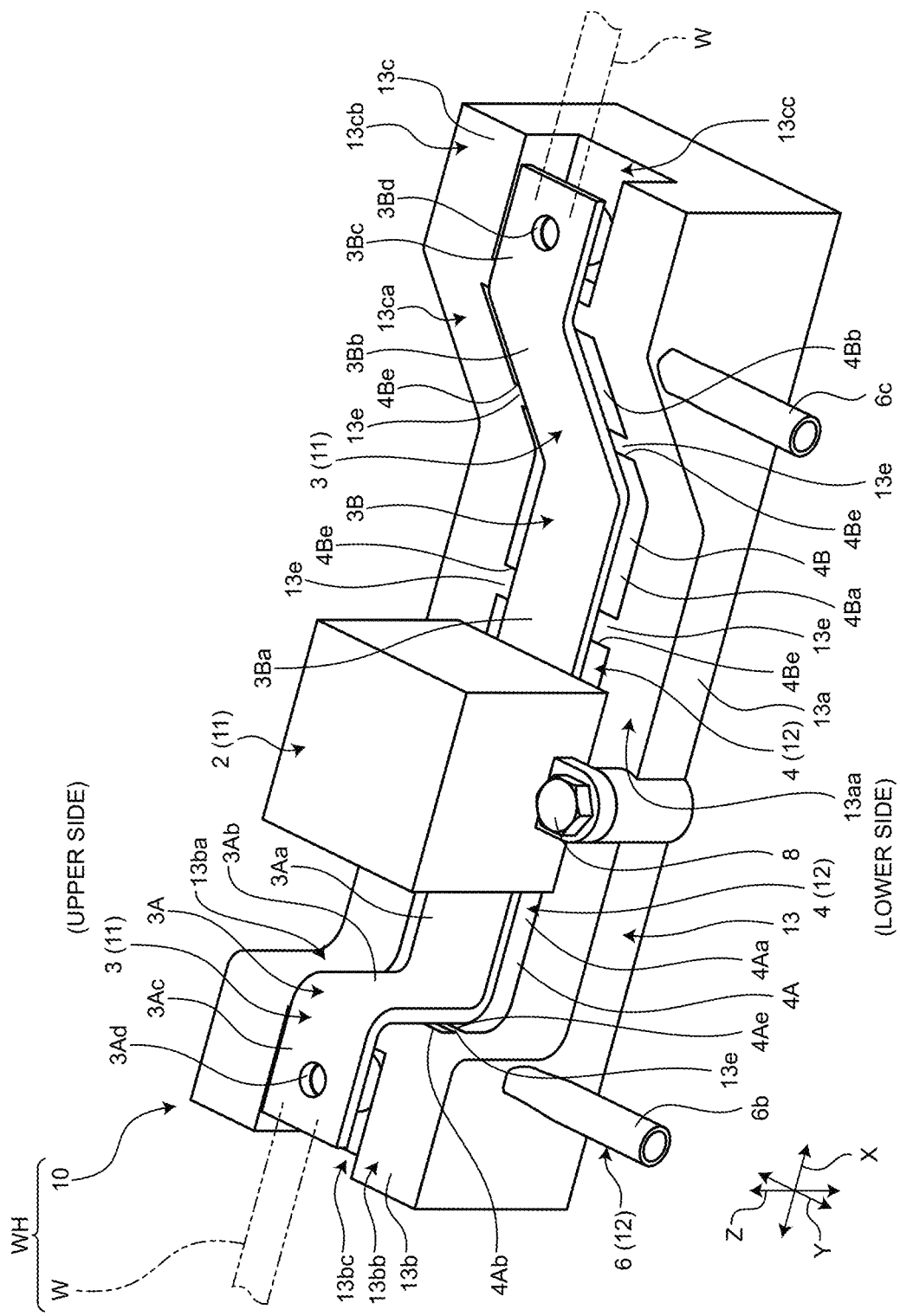
FIG. 1 is a perspective view of an electrical junction box and a wire harness according to an embodiment.

The electrical junction box 10 of the embodiment is mounted on a vehicle such as an automobile and incorporated in a wire harness WH as illustrated in FIG. 1. The wire harness WH is, for example, a member connects a plurality of wiring members W used for power supply and signal communication to devices mounted on a vehicle by a connector or the like to connect the devices to each other. The wire harness WH includes the wiring member W having electrical conductivity and the electrical junction box 10 electrically connected to the wiring member W. The wiring member W is formed of, for example, a metal rod, an electric wire, an electric wire bundle, or the like. The metal rod is formed by covering an outer side of an electrically conductive rod-shaped member with an insulating covering portion. The electric wire is formed by covering an outer side of a conductor (core wire) including a plurality of electrically conductive metal element wire with an insulating covering portion. The wire harness WH may further include a grommet, a protector, a fastener, and the like.

The electrical junction box 10 collectively houses therein electronic components such as a connector, a fuse, a relay, a capacitor, a branch portion, an electronic control unit, and an electronic component unit obtained by unitizing these components. The electrical junction box 10 is installed, for example, in an engine room of a vehicle or a vehicle cabin. The electrical junction box 10 is connected between a power supply such as a battery and various electronic devices mounted in the vehicle via the wiring member W or the like. The electrical junction box 10 distributes electric power supplied from a power supply to various electronic devices in the vehicle. The electrical junction box 10 may also be referred to as a junction box, a fuse box, a relay box, or the like, but these are collectively referred to as an electrical junction box in the present embodiment. In each drawing, a part of the electrical junction box 10 is taken out and schematically illustrated.

As illustrated in FIGS. 1 to 5, the electrical junction box 10 of the embodiment includes a heat generating component 11, a cooling unit 12, and a resin case 13.

The heat generating component 11 is a component that generates heat following energization. In the present embodiment, the heat generating component 11 is a relay 2 and a bus bar 3. The heat generating component 11 may be an electronic component such as a connector, a fuse, a capacitor, a branch portion, an electronic control unit, or an electronic component unit obtained by unitizing these components.

The cooling unit 12 cools the heat generating component 11. The cooling unit 12 includes a heat transfer member 4, a metal plate 5, and a metal pipe 6.

The resin case 13 holds the heat generating component 11 and the cooling unit 12.

Details of the electrical junction box 10 will be described below.

Figure 2:
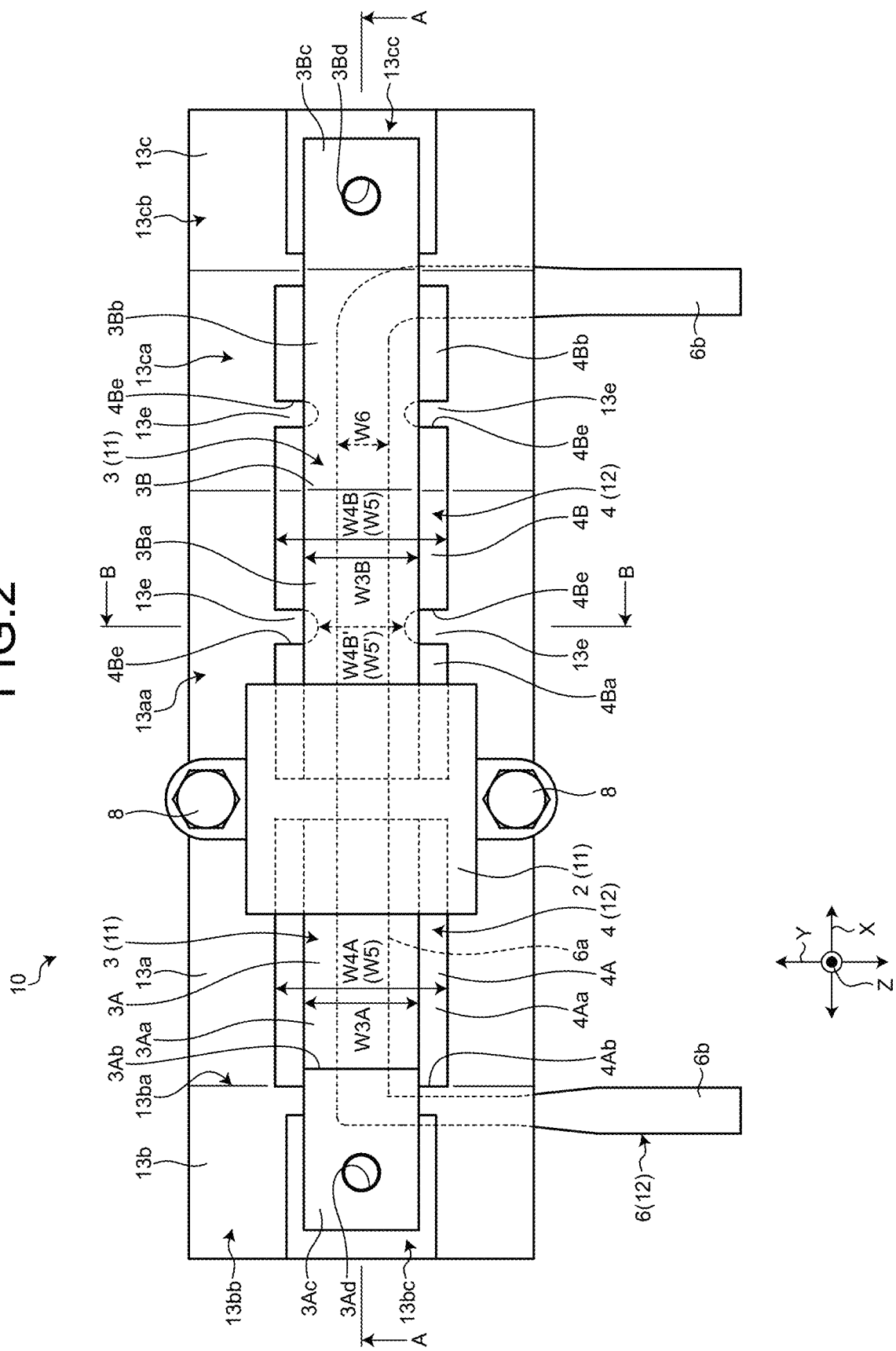
FIG. 2 is a plan view of the electrical junction box according to the embodiment.
Figure 3:
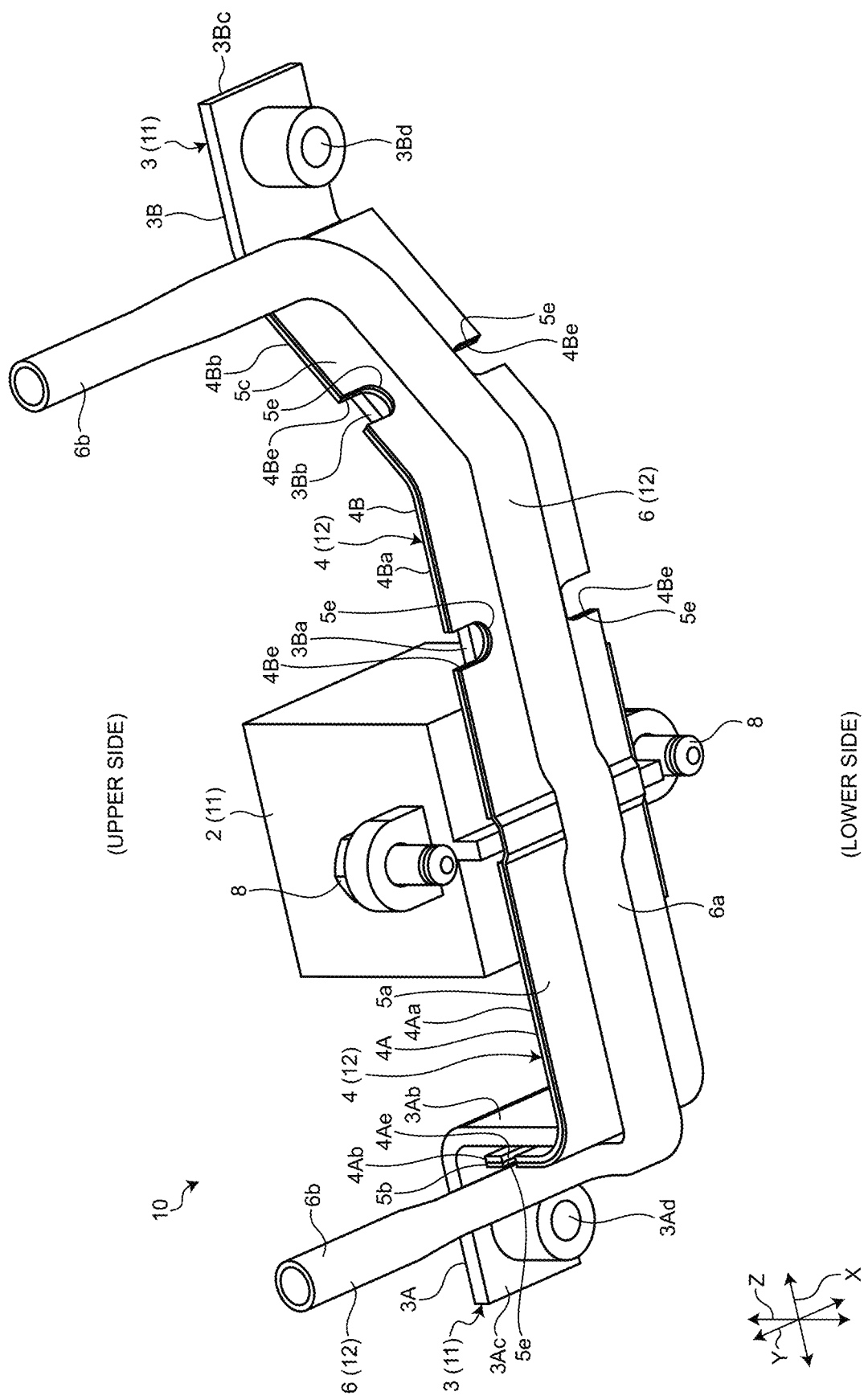
FIG. 3 is a perspective view of the electrical junction box according to the embodiment, excluding a resin case.

As illustrated in FIGS. 1 and 2, the resin case 13 is formed of an insulating synthetic resin. The resin case 13 includes a base 13*a*, a one end 13*b*, and an other end 13*c*.

The base 13*a* is formed in a plate shape so as to have a predetermined width dimension in the width direction Y, a predetermined length dimension in the length direction X, and a height dimension in the height direction Z being constant over the width direction Y and the length direction X. The base 13*a* includes an upper face 13*aa* that is flat along a plane formed by the width direction Y and the length direction X in a face on the upper side in the height direction Z.

The one end 13*b* is provided on one side of the base 13*a* in the length direction X. The one end 13*b* is formed integrally on one side of the base 13*a* in the length direction X. The one end 13*b* is formed on one side of the base 13*a* in the length direction X so as to have the same dimension as the width dimension of the base 13*a* in the width direction Y and to have a larger height dimension in the height direction Z. Specifically, the one end 13*b* includes an upright face 13*ba* rising upward from the upper face 13*aa* of the base 13*a* and being flat along a vertical plane formed by the width direction Y and the height direction Z. The one end 13*b* includes a top face 13*bb* that is continuous to the upper end of the upright face 13*ba* and is parallel to the upper face 13*aa* of the base 13*a*. Therefore, the one end 13*b* constitutes a step protruding upward in the height direction Z on one side of the base 13*a* in the length direction X. The one end 13*b* includes a cutout 13*bc* that is recessed downward in the height direction Z in the top face 13*bb*.

The other end 13*c* is provided on the other side of the base 13*a* in the length direction X. The other end 13*c* is formed integrally on the other side of the base 13*a* in the length direction X. The other end 13*c* is formed on the other side of the base 13*a* in the length direction X so as to have the same dimension as the width dimension of the base 13*a* in the width direction Y and to have a larger height dimension in the height direction Z. Specifically, the other end 13*c* includes a slope 13*ca* rising obliquely upward from the upper face 13*aa* of the base 13*a*. The other end 13*c* includes a top face 13*cb* that is continuous to the upper end of the slope 13*ca* and is parallel to the upper face 13*aa* of the base 13*a*. Therefore, the other end 13*c* constitutes a step protruding upward in the height direction Z on the other side of the base 13*a* in the length direction X. The other end 13*c* includes a cutout 13*cc* that is recessed downward in the height direction Z in the top face 13*cb*.

As illustrated in FIGS. 1 and 2, the relay 2 of the heat generating component 11 is disposed on the upper face 13*aa* of the base 13*a* in the resin case 13 and is fixed to the resin case 13 with a bolt 8.

As illustrated in FIGS. 1 and 2, the bus bar 3 of the heat generating component 11 includes a first bus bar 3A and a second bus bar 3B that are independently connected to the relay 2.

The first bus bar 3A is provided to extend from the base 13*a* to the one end 13*b* of the resin case 13. The first bus bar 3A is formed in a plate shape and is then bent by sheet-metal working or pressing so as to be disposed along the upper face 13*aa* of the base 13*a*, the upright face 13*ba* of the one end 13*b*, and the top face 13*bb* of the one end 13*b*. Specifically, the first bus bar 3A is formed by continuously disposing: a connection portion 3Aa connected to the relay 2 along the upper face 13*aa* of the base 13*a*; an intermediate portion 3Ab along the upright face 13*ba* of the one end 13*b*; and a connection portion 3Ac connected to the wiring member W along the top face 13*bb* of the one end 13*b*. The connection portion 3Ac is disposed in the cutout 13*bc* of the one end 13*b* and is formed with a screw hole 3Ad for fixing and conductively connecting one wiring member W.

Figure 5:
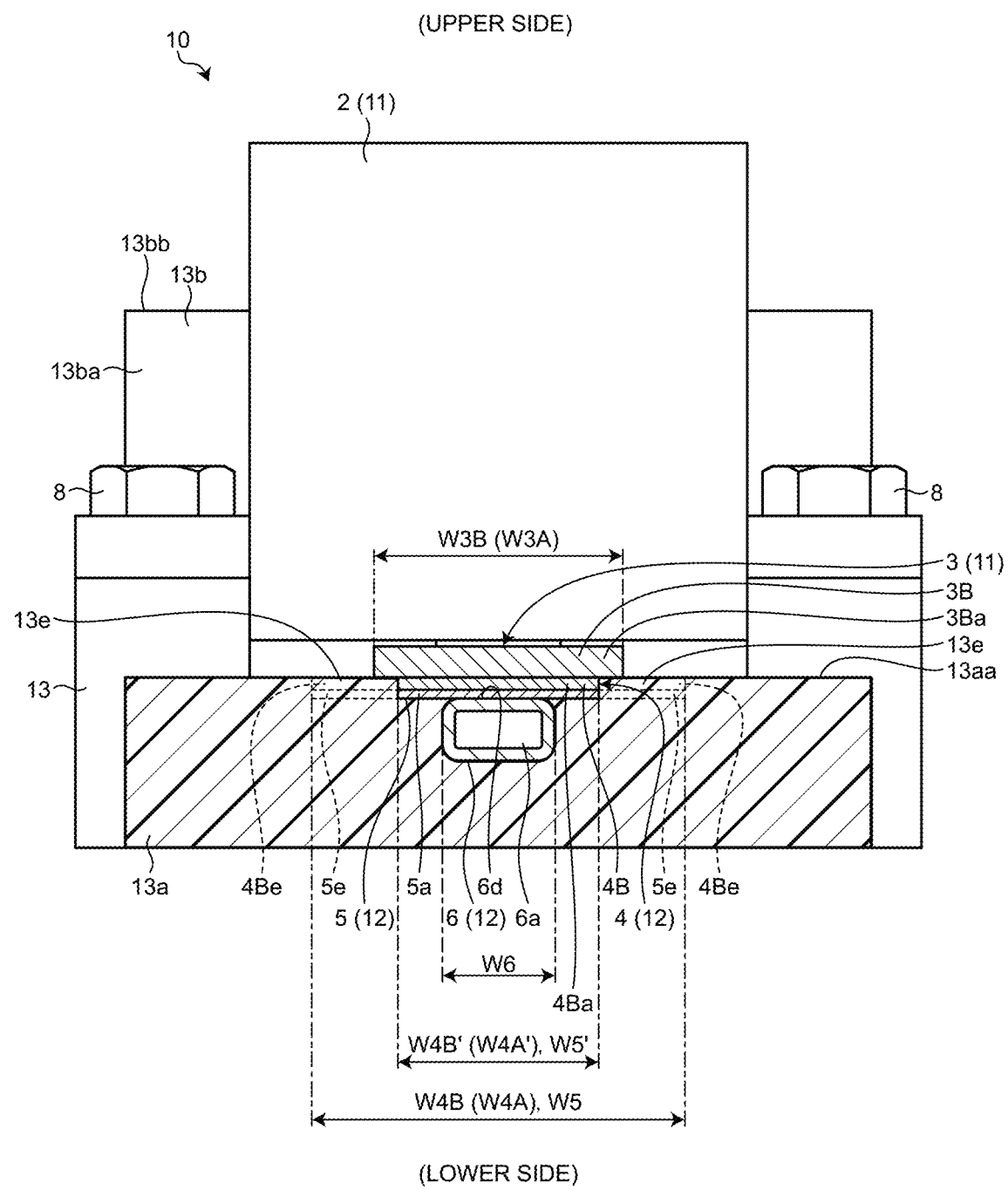
FIG. 5 is a sectional view taken along line B-B of FIG. 2.

The second bus bar 3B is provided to extend from the base 13*a* to the other end 13*c* of the resin case 13. The second bus bar 3B is formed in a plate shape and is then bent by sheet-metal working or pressing so as to be disposed along the upper face 13*aa* of the base 13*a*, the slope 13*ca* of the other end 13*c*, and the top face 13*cb* of the other end 13*c*. Specifically, the second bus bar 3B is formed by continuously disposing: a connection portion 3Ba connected to the relay 2 along the upper face 13*aa* of the base 13*a*; an intermediate portion 3Bb along the slope 13*ca* of the other end 13*c*; and a connection portion 3Bc connected to the wiring member W along the top face 13*cb* of the other end 13*c*. The connection portion 3Bc is disposed in the cutout 13*cc* of the other end 13*c* and is formed with a screw hole 3Bd for fixing and conductively connecting the other wiring member W. As illustrated in FIGS. 2 and 5, in the present embodiment, the second bus bar 3B has a width dimension W3B in the width direction Y formed to be the same as a width dimension W3A of the first bus bar 3A in the width direction Y.

The heat transfer member 4 of the cooling unit 12 has insulating properties. As illustrated in FIGS. 1 to 5, the heat transfer member 4 includes a first heat transfer member 4A in contact with the first bus bar 3A and a second heat transfer member 4B in contact with the second bus bar 3B.

The first heat transfer member 4A is provided to extend from the base 13a to the one end 13b of the resin case 13. The first heat transfer member 4A is formed in a plate shape so as to overlap the first bus bar 3A, and is then bent along the connection portion 3Aa and the intermediate portion 3Ab. Specifically, the first heat transfer member 4A is formed by continuously disposing: a flat portion 4Aa overlapping and being in contact with the connection portion 3Aa; and a rising portion 4Ab overlapping and being in contact with the intermediate portion 3Ab. With respect to the resin case 13, the first heat transfer member 4A is disposed to be embedded in the base 13a such that the plate face of the flat portion 4Aa is flush with the upper face 13aa of the base 13a and to be embedded in the one end 13b such that the plate face of the rising portion 4Ab is flush with the upright face 13ba of the one end 13b. Each plate face of the first heat transfer member 4A faces and comes into contact with the plate face of the first bus bar 3A. As illustrated in FIGS. 2 and 5, in the present embodiment, the first heat transfer member 4A has a width dimension W4A in the width direction Y formed to be greater than the width dimension W3A of the first bus bar 3A in the width direction Y.

The first heat transfer member 4A includes cutouts 4Ae formed at ends thereof in the width direction Y. The cutouts 4Ae are provided to oppose to each other in the width direction Y. The cutouts 4Ae are provided in the rising portion 4Ab of the first heat transfer member 4A. The first heat transfer member 4A is formed such that the width dimension W4A in the width direction Y is narrowed to a width dimension W4A' by the opposing cutouts 4Ae. The width dimension W4A' of the first heat transfer member 4A narrowed by the cutouts 4Ae is smaller than the width dimension W3A of the first bus bar 3A in the width direction Y. A resin member 13e of the resin case 13 is inserted and fitted into the cutouts 4Ae. The resin member 13e fitted into the cutouts 4Ae comes into contact with the plate face of the first bus bar 3A because the width dimension W4A' of the first heat transfer member 4A narrowed by the cutouts 4Ae is smaller than the width dimension W3A of the first bus bar 3A in the width direction Y.

The second heat transfer member 4B is provided to extend from the base 13a to the other end 13c of the resin case 13. The second heat transfer member 4B is formed in a plate shape so as to overlap the second bus bar 3B, and is then bent along the connection portion 3Ba and the intermediate portion 3Bb. Specifically, the second heat transfer member 4B is formed by continuously disposing: a flat portion 4Ba overlapping and being in contact with the connection portion 3Ba; and an inclined portion 4Bb overlapping and being in contact with the intermediate portion 3Bb. With respect to the resin case 13, the second heat transfer member 4B is disposed to be embedded in the base 13a such that the plate face of the flat portion 4Ba is flush with the upper face 13aa of the base 13a and to be embedded in the other end 13c such that the plate face of the inclined portion 4Bb is flush with the slope 13ca of the other end 13c. Each plate face of the second heat transfer member 4B faces and comes into contact with the plate face of the second bus bar 3B. As illustrated in FIGS. 2 and 5, in the present embodiment, the second heat transfer member 4B has a width dimension W4B in the width direction Y formed to be greater than the width dimension W3B of the second bus bar 3B in the width direction Y.

The second heat transfer member 4B includes cutouts 4Be formed at ends thereof in the width direction Y. The cutouts 4Be are provided to oppose to each other in the width direction Y. The cutouts 4Be are provided in the flat portion 4Ba and the inclined portion 4Bb of the second heat transfer member 4B. The second heat transfer member 4B is formed such that the width dimension W4B in the width direction Y is narrowed to a width dimension W4B' by the opposing cutouts 4Be. The width dimension W4B' of the second heat transfer member 4B narrowed by the cutouts 4Be is smaller than the width dimension W3B of the second bus bar 3B in the width direction Y. In addition, the resin member 13e of the resin case 13 is inserted and fitted into the cutouts 4Be. The resin member 13e fitted into the cutouts 4Be comes into contact with the plate face of the second bus bar 3B because the width dimension W4B' of the second heat transfer member 4B narrowed by the cutouts 4Be is smaller than the width dimension W3B of the second bus bar 3B in the width direction Y.

As illustrated in FIGS. 2 to 5, the metal plate 5 of the cooling unit 12 is formed in a plate shape so as to overlap the heat transfer member 4, and is then bent by sheet-metal working or pressing. The metal plate 5 is in contact with the plate face of the heat transfer member 4. Specifically, the metal plate 5 is formed by continuously disposing: a flat portion 5a along the flat portion 4Aa of the first heat transfer member 4A and the flat portion 4Ba of the second heat transfer member 4B; a rising portion 5b along the rising portion 4Ab of the first heat transfer member 4A; and an inclined portion 5c along the inclined portion 4Bb of the second heat transfer member 4B. The metal plate 5 includes a flexure 5f formed away from the heat transfer member 4 at a boundary between the first heat transfer member 4A and the second heat transfer member 4B. As illustrated in FIGS. 2 and 5, in the present embodiment, the metal plate 5 has a width dimension W5 in the width direction Y formed to be the same as the width dimensions W4A and W4B of the heat transfer member 4 in the width direction Y.

Therefore, the metal plate 5 is formed in a shape conforming to the shape of the bus bar 3 (the first bus bar 3A and the second bus bar 3B) as the heat generating component 11 via the heat transfer member 4 (the first heat transfer member 4A and the second heat transfer member 4B). The heat transfer member 4 (the first heat transfer member 4A and the second heat transfer member 4B) intervenes between the bus bar 3 (the first bus bar 3A and the second bus bar 3B) as the heat generating component 11 and the metal plate 5.

The metal plate 5 includes cutouts 5e formed at ends thereof in the width direction Y. The cutouts 5e are formed in the same arrangement and the same shape so as to overlap and match the cutouts 4Ae and 4Be of the heat transfer member 4 in the height direction Z. The cutouts 5e are provided to oppose to each other in the width direction Y. The metal plate 5 is formed such that the width dimension W5 in the width direction Y is narrowed to a width dimension W5' by the opposing cutouts 5e. The width dimension W5' of the metal plate 5 narrowed by the cutouts 5e is the same as the narrowed width dimensions W4A' and W4B' of the heat transfer member 4 and is smaller than the width dimensions W3A and W3B of the bus bar 3 in the width direction Y. The resin member 13e of the resin case 13 is inserted and fitted into the cutouts 5e. The resin member 13e fitted into the cutouts 5e comes into contact with the plate face of the bus bar 3 because the width dimension W5' of the metal plate 5 narrowed by the cutouts 5e is smaller than the width dimensions W3A and W3B of the bus bar 3 in the width direction Y.

As illustrated in FIGS. 1 to 5, the metal pipe 6 of the cooling unit 12 is formed in a tubular shape and includes a base 6a and connection ends 6b and 6c at both ends of the base 6a.

Figure 4:
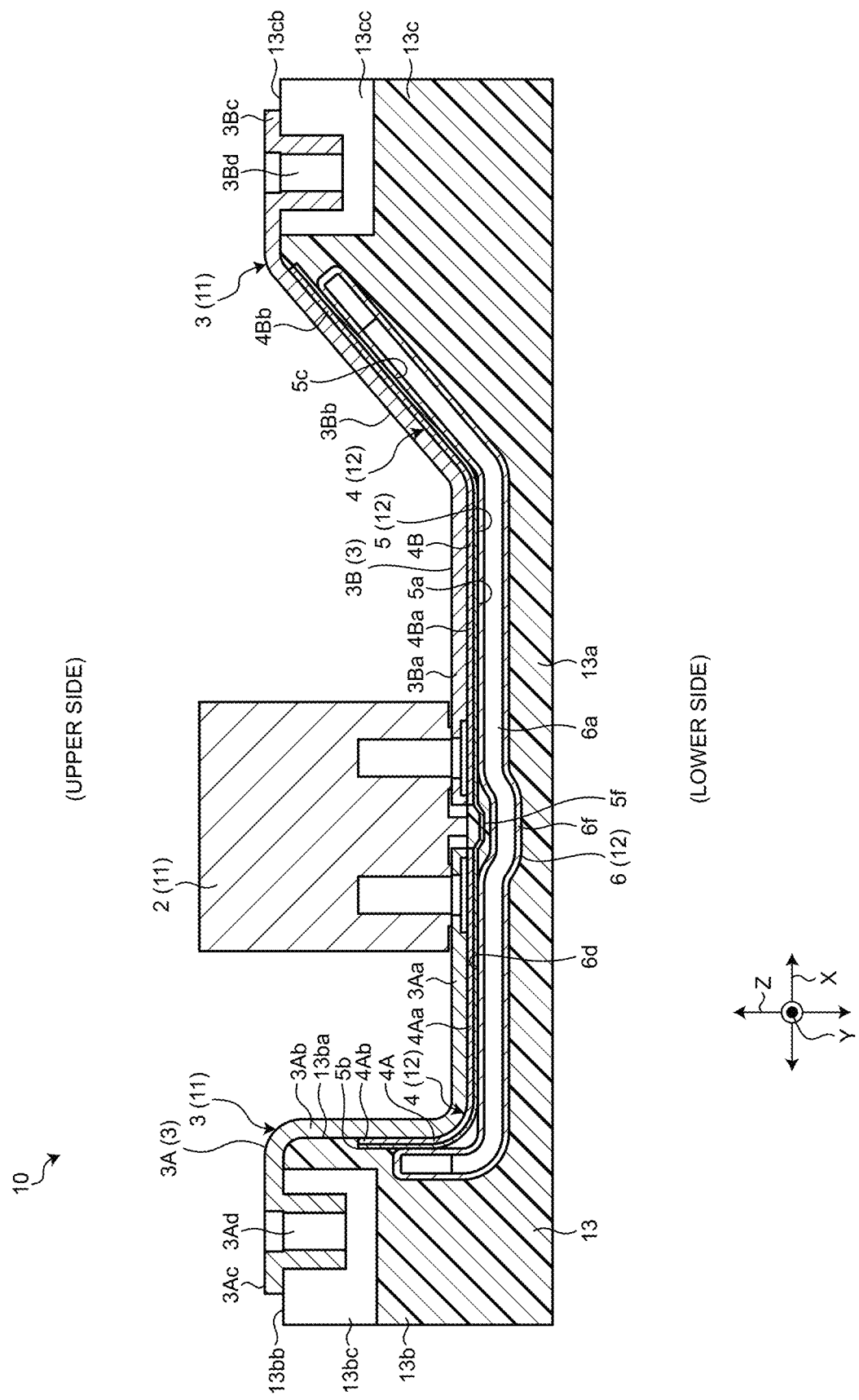
FIG. 4 is a sectional view taken along line A-A of FIG. 2.

The base 6a is provided to extend mainly along the length direction X, is disposed along the metal plate 5, and is disposed on an opposite side of the positions of the bus bar 3 (the first bus bar 3A and the second bus bar 3B) in an opposing manner. Specifically, as illustrated in FIG. 4, the base 6a is bent along the flat portion 5a, the rising portion 5b, and the inclined portion 5c of the metal plate 5. The base 6a is embedded inside the resin case 13. The base 6a is formed with a flat surface portion 6d opposing to and being in contact with the plate face of the metal plate 5. The flat surface portion 6d may be provided on at least one face opposing to the plate face of the metal plate 5 and may be provided on another face. The metal pipe 6 includes a flexure 6f formed away from the metal plate 5 at a boundary between the first heat transfer member 4A and the second heat transfer member 4B. As illustrated in FIGS. 2 and 5, in the present embodiment, the metal pipe 6 (the base 6a) has a width dimension W6 in the width direction Y formed to be smaller than the width dimensions W4A and W4B of the heat transfer member 4 in the width direction Y and than the width dimension W5 of the metal plate 5.

The connection ends 6b and 6c are formed to be bent in the width direction Y from the respective ends of the base 6a and to extend to the outside of the resin case 13. Although not clearly illustrated in the drawing, the connection ends 6b and 6c are connected to a coolant flow path that supplies a coolant to one of the connection ends 6b and 6c and recovers the coolant from the other of the connection ends 6b and 6c. Therefore, the coolant flows through the metal pipe 6. Examples of the coolant include air, water, and antifreeze (long life coolant: LLC).

As described above, the electrical junction box 10 of the embodiment includes: the heat generating component 11, the cooling unit 12 that cools the heat generating component 11, and the resin case 13 that holds the heat generating component 11 and the cooling unit 12. The cooling unit 12 includes: the metal plate 5 being formed in a shape conforming to the shape of the bus bar 3 of the heat generating component 11; the metal pipe 6 that is disposed along and in contact with the metal plate 5 and through which the coolant flows; and the heat transfer member 4 having insulating properties and intervening between the heat generating component 11 and the metal plate 5.

The wire harness WH of the embodiment includes the wiring member W having electrical conductivity, and the electrical junction box 10 being electrically connected to the wiring member W. The electrical junction box 10 includes the heat generating component 11, the cooling unit 12 that cools the heat generating component 11, and the resin case 13 that holds the heat generating component 11 and the cooling unit 12. The cooling unit 12 includes: the metal plate 5 being formed in a shape conforming to the shape of the bus bar 3 of the heat generating component 11; the metal pipe 6 that is disposed along and in contact with the metal plate 5 and through which the coolant flows; and the heat transfer member 4 having insulating properties and intervening between the heat generating component 11 and the metal plate 5.

According to the electrical junction box 10 and the wire harness WH, the heat generated by the heat generating component 11 is transferred to the metal plate 5 having a shape conforming to the shape of the bus bar 3 of the heat generating component 11 and is cooled by the coolant flowing through the metal pipe 6 in contact with the metal plate 5. According to the electrical junction box 10 and the wire harness WH, heat is transferred from the heat generating component 11 to the metal plate 5 while insulating properties are provided by the heat transfer member 4 between the heat generating component 11 and the metal plate 5. Therefore, the electrical junction box 10 and the wire harness WH of the embodiment can improve the cooling performance while achieving reduction in size and weight without increasing the volume of the metal plate 5.

In the electrical junction box 10 and the wire harness WH of the embodiment, the cooling unit 12 includes the cutouts 4Ae and 4Be in the heat transfer member 4, and the resin case 13 includes the resin member 13e fitted into the cutouts 4Ae and 4Be of the heat transfer member 4 and provided in contact with the bus bar 3 of the heat generating component 11.

According to the electrical junction box 10 and the wire harness WH, the resin member 13e of the resin case 13 is fitted into the cutouts 4Ae and 4Be of the heat transfer member 4 and comes into contact with the bus bar 3 of the heat generating component 11, so that the amount of compression of the heat transfer member 4 in the plate thickness direction (height direction Z) is maintained. Therefore, an insulation distance between the metal plate 5 and the heat generating component 11 can be maintained.

In the electrical junction box 10 and the wire harness WH of the embodiment, the cooling unit 12 includes the cutouts 5e matching the cutouts 4Ae and 4Be of the heat transfer member 4 in the metal plate 5, and the resin case 13 includes the resin member 13e also fitted into the cutouts 5e of the metal plate 5.

According to the electrical junction box 10 and the wire harness WH, the provision of the cutouts 5e matching the cutouts 4Ae and 4Be of the heat transfer member 4 in the metal plate 5 enables the cutouts 4Ae and 4Be and the cutouts 5e to be processed together by overlapping the heat transfer member 4 and the metal plate 5. Therefore, manufacturing can be facilitated. Moreover, according to the electrical junction box 10, by fitting the resin member 13e also into the cutouts 5e of the metal plate 5, the position of the metal plate 5 in the width direction Y and the length direction X can be regulated.

In the electrical junction box 10 and the wire harness WH of the embodiment, the metal pipe 6 includes the flat surface portion 6d that opposes to the plate face of the metal plate 5 and is in contact with the plate face of the metal plate 5.

According to the electrical junction box 10 and the wire harness WH, the contact area between the metal plate 5 and the metal pipe 6 can be increased by the flat surface portion 6d opposed to and in contact with the plate face of the metal plate 5 to improve the heat conductivity, and the cooling performance can be improved.

Note that the above-described electrical junction box 10 and wire harness WH according to the embodiment of the present invention is not limited to the above-described embodiment, and various modifications can be made within the scope recited in the claims. The electrical junction box 10 and wire harness WH according to the present embodiment may be configured by appropriately combining the constituent elements of the embodiment and the modifications described above.

The electrical junction box and the wire harness according to the present embodiment can appropriately have cooling performance.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical junction box comprising:
   a heat generating component;
   a cooling unit being configured to cool the heat generating component; and
   a resin case being configured to hold the heat generating component and the cooling unit, wherein
   the cooling unit includes
   a metal plate being formed in a shape conforming to a shape of the heat generating component,
   a metal pipe through which a coolant flows, the metal pipe being disposed along and in contact with the metal plate, and
   a heat transfer member having insulating properties and intervening between the heat generating component and the metal plate.

2. The electrical junction box according to claim 1, wherein
   the cooling unit includes a cutout in the heat transfer member, and
   the resin case includes a resin member being fitted into the cutout of the heat transfer member and being provided in contact with the heat generating component.

3. The electrical junction box according to claim 2, wherein
   the cooling unit includes, in the metal plate, a cutout matching the cutout of the heat transfer member, and
   the resin member of the resin case is also fitted into the cutout of the metal plate.

4. The electrical junction box according to claim 1, wherein
   the metal pipe includes a flat surface portion opposing to a plate face of the metal plate and being in contact with the plate face of the metal plate.

5. A wire harness comprising:
   a wiring member having electrical conductivity; and
   an electrical junction box being electrically connected to the wiring member, wherein
   the electrical junction box includes
   a heat generating component,
   a cooling unit being configured to cool the heat generating component, and
   a resin case being configured to hold the heat generating component and the cooling unit, and
   the cooling unit includes
   a metal plate being formed in a shape conforming to a shape of the heat generating component,
   a metal pipe through which a coolant flows, the metal pipe being disposed along and in contact with the metal plate, and
   a heat transfer member having insulating properties and intervening between the heat generating component and the metal plate.

* * * * *